(12) United States Patent
Chakraborty et al.

(10) Patent No.: US 7,594,150 B2
(45) Date of Patent: Sep. 22, 2009

(54) FAULT-TOLERANT ARCHITECTURE OF FLIP-FLOPS FOR TRANSIENT PULSES AND SIGNAL DELAYS

(75) Inventors: Tapan Jyoti Chakraborty, West Windsor, NJ (US); Aditya Jagirdar, Highland Park, NJ (US); Roystein Oliveira, Highland Park, NJ (US)

(73) Assignees: Alcatel-Lucent USA Inc., Murray Hill, NJ (US); Rutgers, The State University of New Jersey, New Brunswick, NJ (US)

( * ) Notice: Subject to any disclaimer, the term of this patent is extended or adjusted under 35 U.S.C. 154(b) by 368 days.

(21) Appl. No.: 11/431,814

(22) Filed: May 10, 2006

(65) Prior Publication Data

US 2007/0266282 A1 Nov. 15, 2007

(51) Int. Cl.
*G06F 11/00* (2006.01)

(52) U.S. Cl. .............................. 714/746; 714/2; 714/30; 714/48; 714/700; 714/709; 714/724; 714/726; 714/727; 714/729; 714/733; 714/734; 714/747; 714/799; 714/818; 714/819; 327/34; 327/36; 327/165; 327/218; 327/211; 327/57; 327/107; 327/166; 327/176; 326/12; 326/26; 326/28

(58) Field of Classification Search ....................... None
See application file for complete search history.

(56) References Cited

U.S. PATENT DOCUMENTS

| | | | | |
|---|---|---|---|---|
| 4,118,686 A | * | 10/1978 | Lender | ........................ 375/292 |
| 5,170,396 A | * | 12/1992 | Rivers et al. | ................. 714/709 |
| 5,233,617 A | * | 8/1993 | Simmons et al. | ............ 714/814 |
| 6,453,431 B1 | * | 9/2002 | Bernstein et al. | ............ 714/700 |
| 7,278,074 B2 | * | 10/2007 | Mitra et al. | ................... 714/724 |
| 7,278,076 B2 | * | 10/2007 | Zhang et al. | ................. 714/726 |
| 7,373,572 B2 | * | 5/2008 | Mak et al. | .................... 714/729 |
| 7,409,631 B2 | * | 8/2008 | Tschanz et al. | ............. 714/798 |
| 2003/0061564 A1 | * | 3/2003 | Maddux | ...................... 714/798 |
| 2006/0015786 A1 | * | 1/2006 | Mitra et al. | ................... 714/724 |

OTHER PUBLICATIONS

Yi Zhao et al., "Double Sampling Data Checking Technique: An Online Testing Solution for Multisource Noise-Induced Errors on On-Chip Interconnects and Buses," IEEE Transactions on Very Large Scale Integration (VLSI) Systems, vol. 12, No. 6, Jun. 2004, pp. 746-755.

W. Chen et al., "Test Generation in VLSI Circuits for Crosstalk Noise," International Test Conference, Paper 25.3, 1998 UEEE, pp. 641-650.

(Continued)

*Primary Examiner*—John P Trimmings

(57) ABSTRACT

A method and apparatus for a structure of a flip-flop that is tolerant to the noise pulses occurring due to the presence of crosstalk faults by sampling the input data multiple times before and after the active clock edge. The final stored value at the flip-flop is determined by the resolution of a counter circuit residing in the flip-flop, which is activated at the change of the sampled input data. This counter based resolution mechanism allows for the detection and filtering of the noise pulse induced at the input of the flip-flop due to a crosstalk fault.

17 Claims, 6 Drawing Sheets

OTHER PUBLICATIONS

A. D. Sathe et al., "Analog Macromodeling of Capacitive Coupling Faults in Digital Circuit," ITC International Test Conference, 2002 IEEE, pp. 375-383.

Yi Zhao and S. Dey, "Analysis of Interconnect Crosstalk Defect Coverage of Test Sets," ITC International Test Conference, 2000 IEEE, pp. 492-501.

X. Bai and S. Dey, "High-Level Crosstalk Defect Simulation Methodology for System-on-Chip Interconnects," IEEE Transactions on Computer-Aided Design of Integrated Circuits and Systems, vol. 23, No. 9, Sep. 2004, pp. 1355-1361.

J. Xiong and L. He, "Full-Chip Routing Optimization with RLC Crosstalk Budgeting," IEEE Transactions on Computer-Aided Design of Integrated Circuits and Systems, vol. 23, No. 3, Mar. 2004, pp. 366-377.

M, Kamon et al., "Fasthenry: A Multipole-Accelerated 3-D Inductance Extraction Program," IEEE Transactions on Microwave Theory and Techniques, vol. 42, No. 9, Sep. 1994, pp. 1750-1758.

C. Metra et al., "Self-Checking Detection and Diagnosis of Transient, Delay, and Crosstalk Faults Affecting Bus Lines," IEEE Transactions on Computers, vol. 49, No. 6, Jun. 2000, pp. 560-574.

M. Lajolo, "Bus Guardians: An Effective Solution for Online Detection and Correction of Faults Affecting System-On-Chip Buses," IEEE Transactions on Very Large Scale Integration (VLSI) Systems, vol. 9, No. 6, Dec. 2001, pp. 974-982.

S. Mitra et al., "Robust System Design With Built-In Soft-Error Resilience," published by the IEEE Computer Society, Feb. 2005, pp. 43-52.

M. Nicolaidis, "Time Redundancy Based Soft-Error Tolerance to Rescue Nanometer Technologies," Proceedings $17^{th}$ IEEE VLSI Symposium, pp. 89-94, 1999.

A. Sinha et al., "Validation and Test Issues Related to Noise Induced by Parasitic Inductances of VLSI Interconnects," IEEE Transactions on Advanced Packaging, vol. 25, No. 3, Aug. 2002, pp. 329-339.

Y. I. Ismail et al., "Figures of Merit to Characterize the Importance of On-Chip Inductance," IEEE Transactions on Very Large Scale Integration (VLSI) Systems, vol. 7, No. 4, Dec. 1999, pp. 442-449.

W.-Y. Chen et al., "Analytical Models for Crosstalk Excitation and Propagation in VLSI Circuits," IEEE Transactions on Computer-Aided Design of Integrated Circuits and Systems, vol. 21, No. 10, Oct. 2002, pp. 117-1131.

* cited by examiner

100

FAULT-TOLERANT ARCHITECTURE OF FLIP-FLOPS FOR TRANSIENT PULSES AND SIGNAL DELAYS

FIELD OF THE INVENTION

The invention relates to the field of integrated circuits and, more specifically, to fault tolerant architecture of flip-flops for transient pulses and signal delays.

BACKGROUND OF THE INVENTION

As the microelectronics industry progresses further in the deep submicron technology, one of the major issues facing the chip design industry is the occurrence of on-chip interconnect crosstalk faults. A crosstalk fault occurs when two neighboring signal lines affect each other due to the coupling capacitance and inductance between them, which results in the propagation of wrong logic values to the gates or registers driven by these signal lines. Typically, crosstalk prone fault sites are detected by auditing the chip layout, and corrective measures are taken in the layout to avoid the possibility of a crosstalk fault occurring by separating these signal lines further apart.

SUMMARY OF THE INVENTION

Various deficiencies in the prior art are addressed through the invention of a method and apparatus for fault recovery for transient pulses and signal delays. In one embodiment, the present invention provides a crosstalk tolerant flip-flop (XTFF) including a scan flip-flop having a scan portion and a system flip-flop and a crosstalk error detection and correction unit (XEDCU) switchable between a functional mode of operation and a scan mode of operation, where an input data is sampled multiple times before and after an active clock edge. In another embodiment, the invention includes receiving a first value for an input signal sampled after a clock edge on a data line of a flip-flop. Then, a second value for the input signal is sampled after sampling the first value. A transition is detected on the data line. A noise pulse is filtered if the input signal is a transient pulse. The data is recovered from a delayed signal. The correct data is latched into the system slave latch.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The present invention is discussed in the context of an integrated circuit architecture comprising of a plurality of registers; however, the present invention can be readily applied to other circuit architectures. In general, the present invention enables the integrated circuit to be tolerant of noise pulses due to the presence of crosstalk faults. The circuit operates in two different modes. It switches between a functional mode of operation that employs its concurrent fault-recovery scheme and a scan mode of operation, which helps carry out stuck-fault testing of the internal hardware on the chip during the manufacturing test of the chip.

Figure 1:
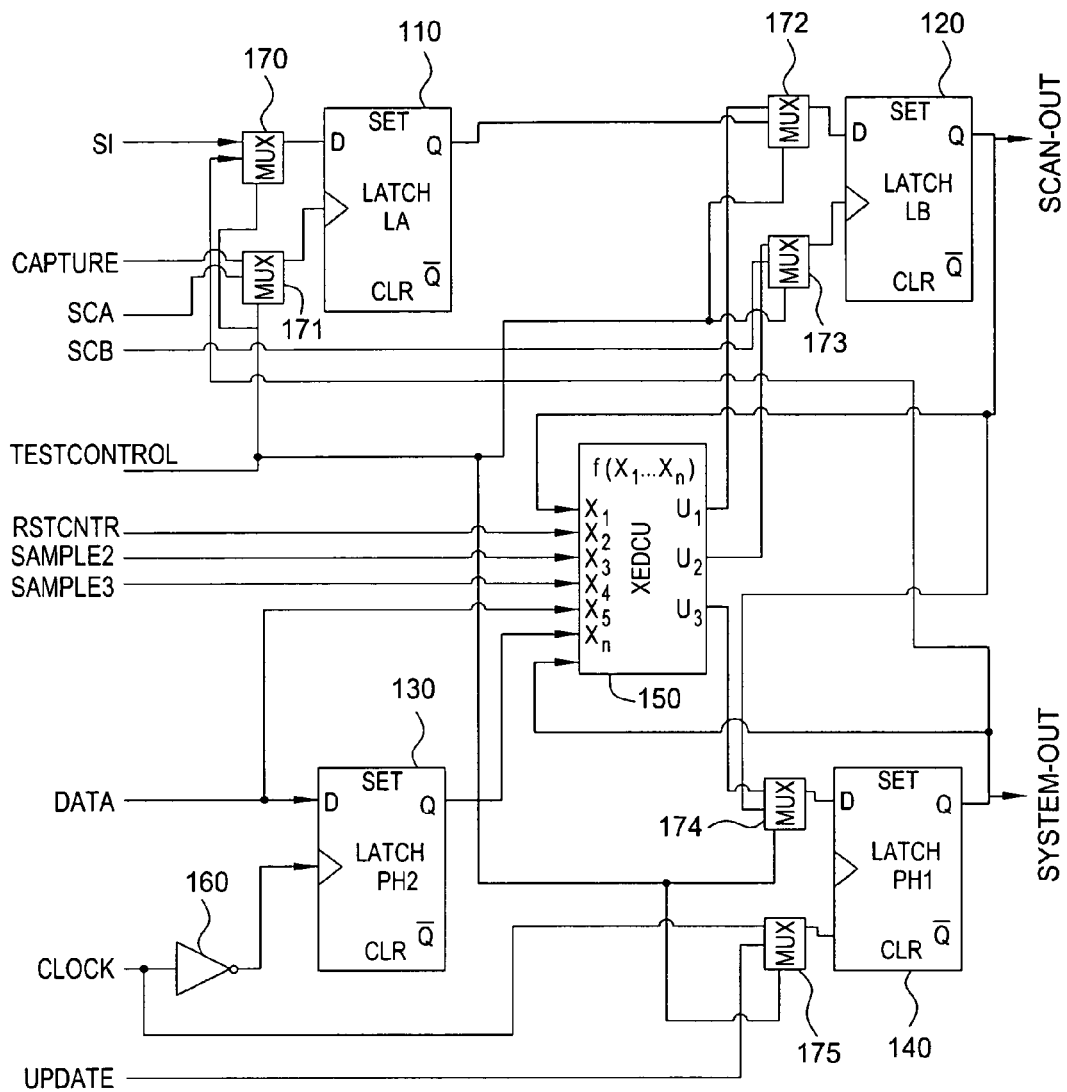
FIG. 1 depicts a high-level block diagram of a crosstalk tolerant flip-flop (XTFF) architecture according to one embodiment of the invention.

FIG. 1 depicts a high-level block diagram of a crosstalk tolerant flip-flop (XTFF) architecture according to one embodiment of the invention. The architecture includes four latches: PH2 130, PH1 140, LA 110 and LB 120, a Crosstalk Error Detection and Correction Unit (XEDCU) 150, an inverter 160 and six multiplexers 170, 171, 172, 173, 174, and 175.

Latch LA 110 receives two input signals and provides one output signal. It receives a signal from the multiplexer 170 on its data line. It also receives a signal from multiplexer 171 and provides an output signal Q to multiplexer 172. In one embodiment, Latch LA 110 is a D flip-flop. Other flip-flops and/or latches may be used.

Latch LB 120 receives two signals and provides a SCAN-OUT signal. It receives a signal from multiplexer 172 on its data line. It also receives a signal from multiplexer 173 and provides the SCAN-OUT signal at output Q. SCAN-OUT is also provided to the XEDCU 150 and multiplexer 174. In one embodiment, Latch LB is a D flip-flop. However, other flip-flops and/or latches may be used.

Latch PH2 130 receives two signals and provides an output signal. It receives a data signal DATA on its data line. It also receives an inverted clock signal from inverter 160. It outputs its Q signal to the XEDCU 150. In one embodiment, Latch PH2 130 is a D flip-flop. However, other flip flops and/or latches may be used.

Latch PH1 140 receives two input signals and transmits a SYSTEM-OUT signal. It receives a signal from multiplexer 174 on the data line. It also receives a signal from multiplexer 175. The Latch PH1 140 provides the SYSTEM-OUT signal from Q that is sent to the XEDCU 150 and multiplexer 170.

XEDCU 150 has n input ports and three output ports; where n is an integer of at least 6. It receives the SCAN-OUT signal from Latch LB 120. It also receives the output signal from latch PH2 130 and the SYSTEM-OUT signal from Latch PH1 140. It also receives four signals, RSTCNTR, SAMPLE2, SAMPLE3, and DATA, from the circuit. The details regarding each signal and function of the XEDCU 150 are described in detail below. The XEDCU 150 provides three outputs u1, u2 and u3. The u1 signal is sent to the multiplexer 172. The u2 signal is sent to the multiplexer 173, and the u3 signal is sent to multiplexer 174. The XEDCU splits its fault-recovery operation into three main parts. It detects a transition on the data line. It filters a noise pulse if incoming signal is a transient pulse. It also recovers data from a delayed signal. The corrected value is then latched into PH1. These three parts are described below.

The inverter 160 receives the clock signal and transmits an output signal that is inverted. The output of the inverted clock signal is provided to the Latch PH2 130.

The multiplexer 170 receives two input signals and provides one output signal. It receives signal SI and SYSTEM-OUT from the output of Latch PH1 140. The received signal is selected via the signal TESTCONTROL. The output signal of multiplexer 170 is transmitted on the data line to Latch LA 110.

The multiplexer 171 receives two input signals and provides one output signal. It receives signals CAPTURE and SCA. The received signal is selected via the signal TESTCONTROL. The output signal of multiplexer 171 is sent to Latch LA 110.

The multiplexer 172 receives two input signals and provides one output signal. It receives the output signal from Latch LA 110 and u1 output signal from XEDCU 150. The operation is selected by the TESTCONTROL signal. The output signal from the multiplexer 172 is transmitted on the data line to Latch LB 120.

The multiplexer 173 receives two input signals and provides one output signal. It receives the u2 output signal from XEDCU 150 and clock signal SCB. The signal is selected using the signal TESTCONTROL. The output signal from the multiplexer 173 is sent to Latch LB 120.

The multiplexer 174 receives two input signals and provides one output signal. It receives as input the output signal u3 from the XEDCU 150 and SCAN-OUT from the output of LATCH LB 120. The enable signal for the multiplexer is TESTCONTROL signal. The output of the multiplexer 174 is transmitted to Latch PH1 140.

The multiplexer 175 receives two input signals and provides one output signal. It receives the clock signal and signal UPDATE as input signals. The multiplexer 175 is enabled by signal TESTCONTROL. The output signal of the multiplexer 175 is sent to Latch PH1 140.

The Latches PH2 and PH1 correspond to the system master and system slave latches respectively, and the latches LA and LB correspond to the scan master and scan slave respectively. The state of the TESTCONTROL signal determines the operation of the circuit (e.g., '0' for functional mode, '1' for scan mode). The signals UPDATE, CAPTURE, SI, SCA, and SCB in FIG. 1 have the same functionality as in a conventional general purpose scan flip-flop. For example, signals SCA and SCB are used as clock signals.

Figure 2:
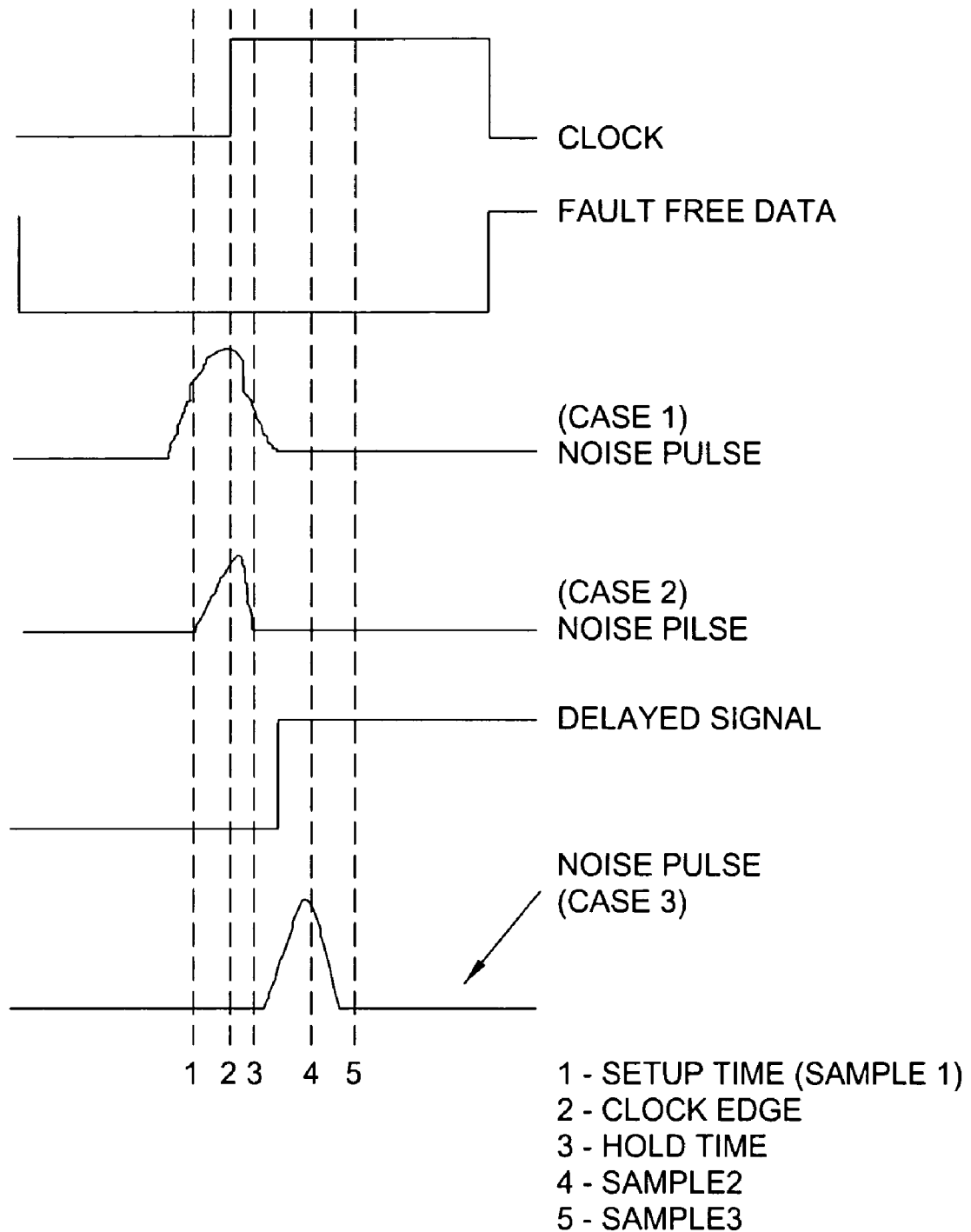
FIG. 2 illustrates exemplary signal waveforms on the data line of FIG. 1 with the clock signal as a reference.

FIG. 2 illustrates exemplary signal waveforms on the data line of FIG. 1 with the clock signal as a reference. Crosstalk induced effects is analyzed more objectively and effectively with the help of a fault model. In one embodiment, crosstalk noise pulse, in the digital domain, is modeled as a signal with a relatively small pulse width, $TX_{pulse}$. The time interval between sample1, sample2 and sample3 depends on the specific design parameters of the flip-flop and related to the various technology parameters.

Two types of crosstalk induced effects are corrected by the XTFF. The first one is a noise pulse. A noise pulse is transient in nature and can cause errors when its peak voltage (i.e., maximum undershoot for a logic high data) exceeds half the supply voltage. Sample noise waveforms are shown in FIG. 2. A general purpose scan flip flop is susceptible to noise pulses because it observes the incoming data only at the instants, Sample1 (i.e., setup time) and Hold time. The logic value during the hold time is more important in controlling the value latched into the master latch PH2. For a correct value to be propagated or latched into PH2, it must remain stable during this interval. Thus, there arise two cases in which a hold-time violation occurs.

The first case occurs when a noise pulse is induced before the setup time and dies away after the hold time has elapsed. The second case occurs when a noise pulse has a steeper rise time so it occurs after the setup time and remains high during the hold time. Both the cases are shown in FIG. 2. The logic values received by the flip-flop for these two cases, during the setup time and hold time are shown in Table 1. Case 1 causes a '1' to be latched into latch PH2; however, Case 2 latches either a '0' or a '1'. This condition needs to be handled by the XTFF as an 'X' (i.e., don't care) value being latched into PH2 at the end of its transparent phase. In one embodiment, a second sampling interval, 'Sample2' is added to detect this latching of incorrect data. This signal remains active for a small period beyond the hold time of the flip-flop. As shown in FIG. 2, the signal on the data line falls back to '0' (i.e., correct value) by the end of the instant, Sample2. Therefore, monitoring the data line for this interval of time, allows for detection of a noise pulse. Table 1 shows the values of different types of signals at the various sampling intervals. Sample2 is a synchronous signal, which is fed to the XTFF. It helps the XTFF to distinguish a noise pulse occurring around the active clock edge, from a good signal by using the values of Sample1, Hold time and Sample2.

TABLE 1

| Nature of Signal | Setup time (Sample1) | Hold time value | Sample2 value | Sample3 value | Value latched in a Scan FF (PH1) | Correct Value latched in XTFF (Latch PH1) |
| --- | --- | --- | --- | --- | --- | --- |
| Fault free | 0 | 0 | 0 | 0 | 0 (correct) | 0 |
| Noise Pulse(case 1) | 1 | 1 | 0 | 0 | 1 (wrong) | 0 |
| Noise pulse(case 2) | 0 | 1 | 0 | 0 | X (wrong) | 0 |
| Delayed Signal | 0 | 0 | 1 | 1 | 0 (wrong) | 1 |
| Noise Pulse(case 3) | 0 | 0 | 1 | 0 | 0 (correct) | 0 |

The second crosstalk induced effect manifests itself in the form of excessive delay in the signal arrival time or transition time. In one embodiment, a signal delay occurs within the same clock cycle. FIG. 2 illustrates the delayed signal that misses the active (i.e., rising) clock edge by a small interval of time. The values at the instants, Sample1 and Hold time are given by Table 1. The value at Sample2, however, is a '1' (i.e., correct value). However, from FIG. 2 and Table 1 Sample2 is a '1' for two types of signals. The first being the delayed signal and the other being a noise pulse (e.g., Case 3). In one embodiment, if the first edge on the data line occurs during the active period of Sample2 and then dies away after Sample2 has become inactive, this type of noise pulse (i.e., FIG. 2, case 3) appears to be the delayed signal. Therefore, relying on only one sampling signal may lead to inaccurate analysis of a delayed signal. To avoid this erroneous interpretation of the data, in one embodiment, another signal, Sample3, is utilized. This signal is activated at the falling edge of Sample2. Sample3 has a pulse width smaller than that of Sample2. From Table 1, the logic values for Sample3 are different for the delayed signal and noise pulse (e.g., case 3). Therefore, by observing and comparing the values at Sample2 and Sample3, a delayed signal from a noise pulse is distinguished. Thus, based on the patterns shown in Table 1, the XTFF is capable of deciding the nature of an incoming signal.

Figure 3:
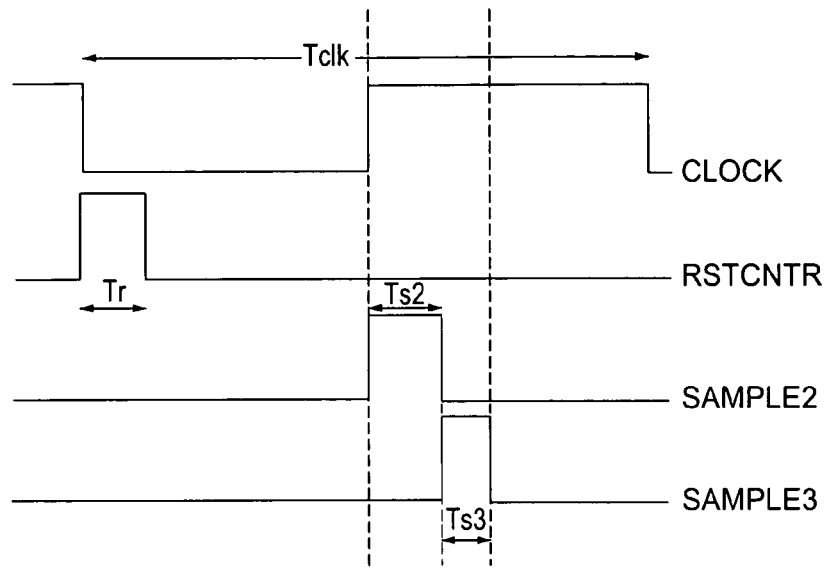
FIG. 3 illustrates waveforms of synchronous signals relative to the system clock according to one embodiment of the invention.

FIG. 3 illustrates waveforms of synchronous signals relative to the system clock according to one embodiment of the invention. The XTFF relies on a counter to record arrival of the edges on the data line. It can be seen that the latch LB is not involved during the functional mode of operation in a conventional scan flip flop. In the XTFF, this latch is converted into a 1-bit counter. The state of this counter gets complemented whenever an edge arrives on the data line. This counter needs to be initialized to a '0' at the beginning of every clock cycle. This is to prevent the state of the counter in the current clock cycle from being affected by its state from a previous clock cycle. A signal, RSTCNTR, is generated to carry out this initialization operation at the beginning of every clock cycle. Successful operation of the XTFF depends on reliable generation of the signals: RSTCNTR, Sample2 and Sample3.

Figure 4:
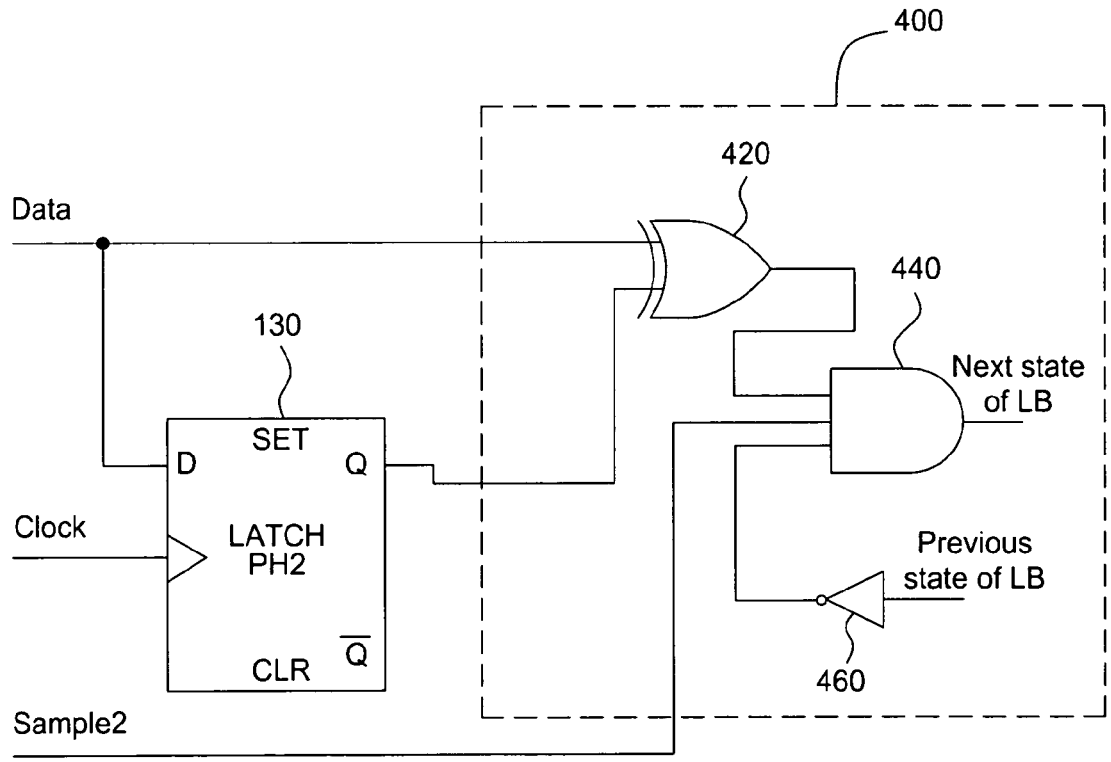
FIG. 4 depicts a high-level block diagram of an edge detection circuit according to one embodiment of the invention.

FIG. 4 depicts a high-level block diagram of an edge detection circuit according to one embodiment of the invention. The edge detection circuit 400 includes a XOR gate 420, an AND gate 440 and an inverter 460.

The XOR gate 420 has two input connections and one output connection. It receives the DATA signal, which is also transmitted to the Latch PH2 130. The XOR gate also receives the output signal Q from the Latch PH2 130. The output signal of the XOR gate 420 is propagated to the AND gate 440.

The AND gate 440 has three input connections and one output connection. The AND gate 440 receives the output signal from the XOR gate 420. It also receives the output signal from the inverter 460 and the signal Sample2. The AND gate 440 transmits its output signal to multiplexer 172 for Latch LB 120.

The inverter 460 receives a signal representing the previous state of the Latch LB 120. The inverter inverts that signal and provides the inverted signal as its output signal to the AND gate 440.

In one embodiment, in order to detect the occurrence of an edge on the data line, a comparator (i.e., XOR gate 420) is used. An incoming data pulse is first latched into PH2 during its transparent cycle. Once PH2 130 becomes opaque, the value on the output node is compared with the signal on the data line. For every edge that occurs on the data line after the arrival of the clock edge, the state of latch LB is complemented. This process continues only until Sample2 remains active.

Figure 5:
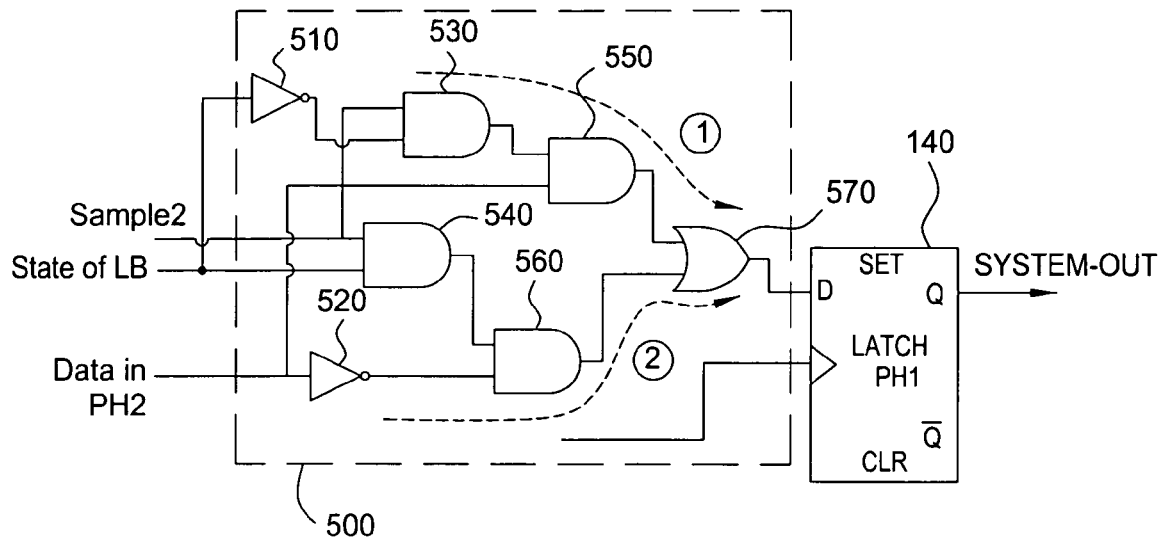
FIG. 5 depicts a high-level block diagram of a noise detection and correction circuit in a crosstalk error detection and correction unit (XEDCU) according to one embodiment of the invention.

FIG. 5 depicts a high-level block diagram of a noise detection and correction circuit 500 in a XEDCU 150 according to one embodiment of the invention.

The noise detection and correction circuit 500 includes two inverters 510, 520, four AND gates 530, 540, 550 and 560, and an OR gate 570.

The inverter 510 receives a signal that represents the state of Latch LB 120. Inverter 510 inverts the received signal and propagates that inverted signal as its output signal to the AND gate 530.

The inverter 520 receives a signal from the Q output of Latch PH2 130, which represents the Data in Latch PH2 130. The inverter 520 inverts that signal and sends it to the AND gate 560.

The AND gate 530 receives two input signals and provides one output signal. The AND gate 530 receives the signal Sample2 and the output signal from the inverter 510. After performing the AND operation, the AND gate 530 propagates its output signal to the AND gate 550.

The AND gate 540 receives two input signals and provides one output signal. The AND gate 540 receives the signal Sample 2 and the signal that represents the state of the Latch LB 120. After performing the AND operation, the AND gate 540 propagates its output signal to the AND gate 560.

The AND gate 550 receives two input signals and provides one output signal. The AND gate 550 receives one signal from the Q output of Latch PH2 130, which represents the Data in Latch PH2 130. It also receives the output signal from the AND gate 530. After performing the AND operation to the two received signals, the AND gate 550 propagates the result as its output signal to the OR gate 570.

The AND gate 560 receives two input signals and provides one output signal. The AND gate 560 receives the signal from the output of inverter 520, which represents the inverted Data from Latch PH2 130. It also receives the output signal from the AND gate 540. After performing the AND operation to the two received signals, the AND gate 560 sends its output signal to the OR gate 570.

The OR gate 570 receives two signals and provides an output signal to the Latch PH1 140 as data in D. The OR gate 570 receives the output signals from AND gate 550 and AND gate 560. After performing the OR operation, the OR gate 570 send the resulting signal to Latch PH1 140.

The noise detection and correction circuit 500 detects noise and latches in the corrected data into the system slave latch PH1 140. In one embodiment, if a noise pulse arrives on the data line, path 2 is selected when transmitting data from PH2 into PH1.

Pattern shown in Table 1 is used for this operation. The circuit 500 complements the contents of PH2 before latching it into PH1. This is because the value latched into PH2 was an erroneous one. For the case shown in FIG. 2, a '1' (i.e., wrong value) is latched into PH2, but a '0' (i.e., corrected value) is latched into PH1. If no edge occurs, then path 1 is followed when transmitting data from PH2 (i.e., Correct value in this case) into PH1.

Figure 6:
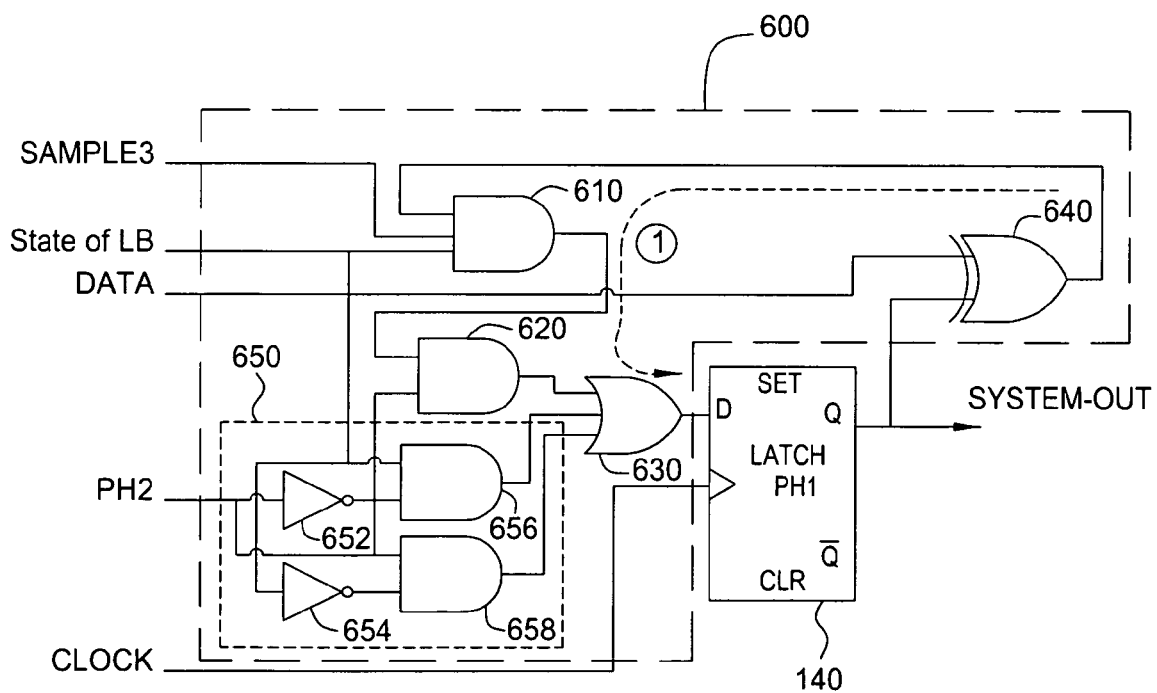
FIG. 6 depicts a high-level block diagram of a signal delay recovery circuit in the XEDCU according to one embodiment of the invention.

FIG. 6 depicts a high-level block diagram of a signal delay recovery circuit 600 in the XEDCU 150 according to one embodiment of the invention.

The signal delay recovery circuit 600 includes two inverters 652, 654, four AND gates 610, 620, 656 and 658, an OR gate 630 and a XOR gate 640.

The inverter 652 receives the output Q signal from Latch PH2 130. It inverts that signal and provides the inverted signal as its output to the AND gate 656.

The inverter 654 receives a signal that represents the state of Latch LB 120. Inverter 654 inverts that received signal and transmits that inverted signal as its output signal to the AND gate 658.

The AND gate 610 receives three signals and provides an output signal to the AND gate 620. The AND gate 610 receives the Sample3 signal, an output signal provided by the XOR gate 640, and a signal that represents the state of the Latch LB 120. After the AND gate 610 performs its operation on the received signals, it propagates the result as its output signal to the AND gate 620.

The AND gate 620 receives two signals and propagates an output signal to the OR gate 630. The AND gate 620 receives as inputs the output signal from the AND gate 610 and the output signal Q from Latch PH2 130. After the AND gate 620 performs its operation on the received signals, it propagates the result to the OR gate 630 via its output path.

The AND gate 656 receives two input signals and provides one output signal. The AND gate 656 receives a signal that represents the state of the Latch LB 120. It also receives the output signal from the inverter 652. After the AND gate 620 performs its operation on the received signals, it propagates the result to the OR gate 630 via its output path.

The AND gate 658 receives two input signals and provide one output signal. The AND gate 658 receives the output Q signal the Latch PH2 130. It also receives the output signal from inverter 654. After the AND gate 658 performs its operation, the result is provided as its output signal to the OR gate 630.

The OR gate 630 includes three input connections and an output connection. The OR gate 630 receives the output signals from the AND gates 620, 630 and 640 via its three input connections. After performing its operation on the input signals, the result is provided via the output connection to the data line D of the Latch PH1 140.

The XOR gate 640 receives two input signals and provides one output signal. The XOR gate 640 receives the signal DATA and the output signal Q from Latch PH1 140. After the XOR gate 640 performs its operation on the received signals, it provides the result as its output signal to AND gate 610.

In FIG. 6, the circuit block 650 indicates the part activated during the previous phase when Sample2 is active. When Sample3 is activated (i.e., high), distinction between a noise pulse (i.e., Case 3, FIG. 2) and a delayed signal is determined. In Case 3, as shown in FIG. 2, path (1) is activated and the correct value stored in latch PH2.

Figure 7:
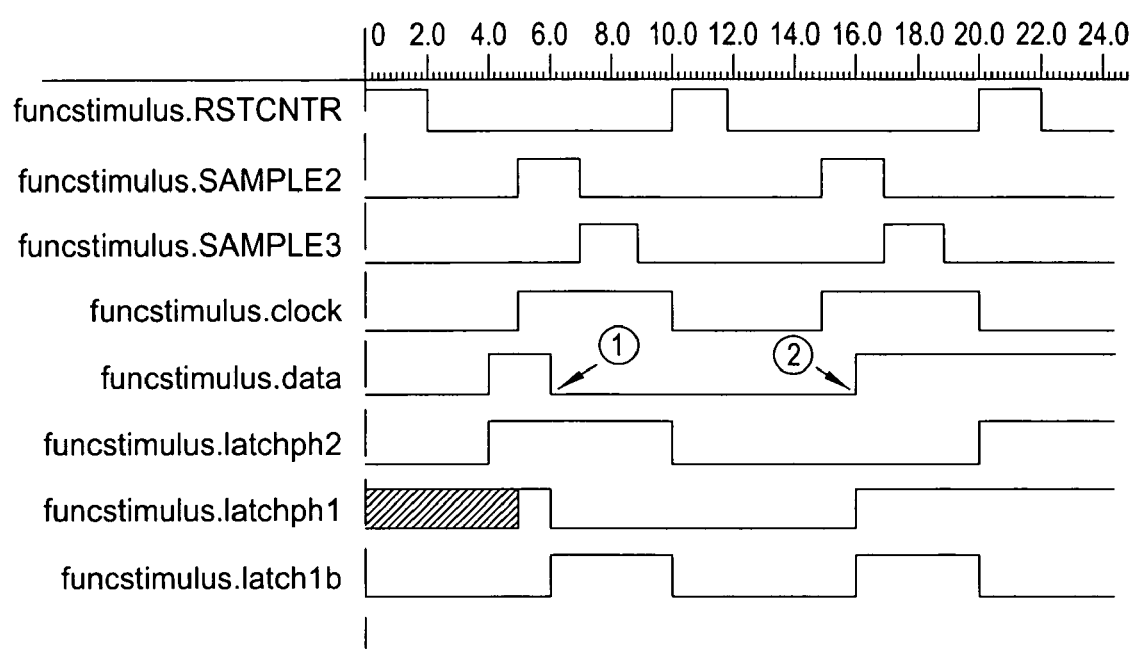
FIG. 7 illustrates a graph of the logic states of results of logic level simulations of the XTFF according to one embodiment of the invention.

The signal delay recovery circuit 600 recovers data from a delayed pulse. In one embodiment, as sown in Table 1, signal values on the data line at Sample2 and Sample3 are both used in determining the final correct value that must be latched into PH1. In one embodiment, the XEDCU 150 includes circuits illustrated in FIG. 4, FIG. 5 and FIG. 6 integrated into a single unit. Digital simulations of the XTFF were carried out using the VCS simulator by Synopsys. FIG. 7 illustrates the results of these simulations.

FIG. 7 illustrates a graph of the logic states of results of logic level simulations of the XTFF according to one embodiment of the invention. In FIG. 7, (1) indicates arrival of a noise pulse on the data line and (2) indicates delay in signal arrival time relative to the active (i.e., rising) clock edge. It is observed that a corrected value gets latched into PH1, for both the cases even when a wrong value is stored in Latch PH2.

Figure 8:
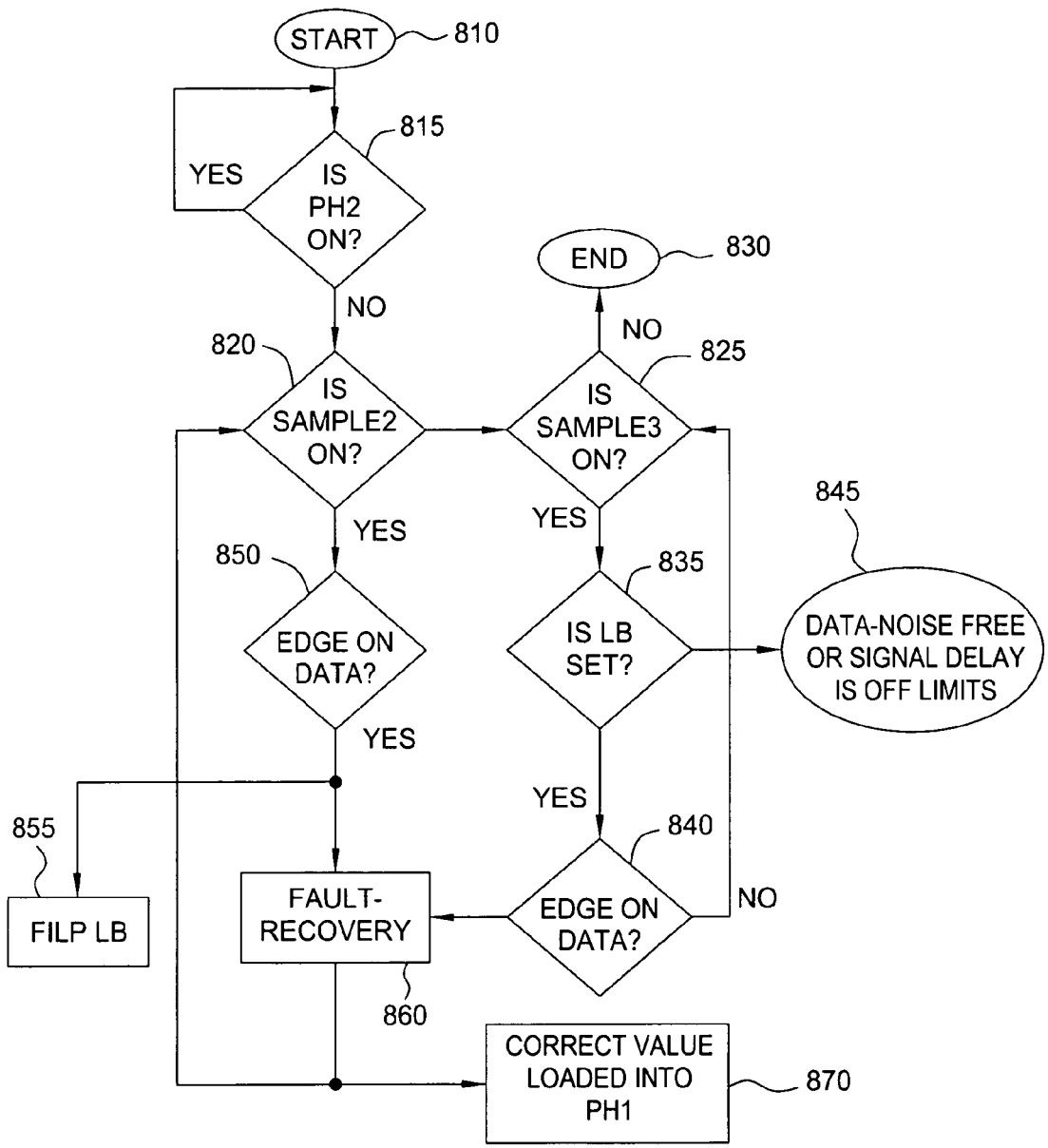
FIG. 8 illustrates a flow chart of decision flow by the XEDCU according to one embodiment of the invention.

FIG. 8 illustrates a flow chart of a decision flow by the XEDCU according to one embodiment of the invention.

At step 810, the decision flow starts.

At step 815, the XEDCU 150 determines if Latch PH2 is active. If the Latch PH2 is on, then it will continue checking the status of the Latch. If the Latch is off, then decision continues to step 820. Step 815 takes place during the first half of the clock cycle. In FIG. 2, this occurs when the clock is '0'. It is during this time that the latch PH2 is transparent.

At step 820, whether the signal, Sample2, is a "1" or "High" is determined. If Sample2 is a 1, then the flow continues to step 850. If Sample2 is a 0, then the XEDCU 150 checks the status of Sample3 at step 825.

At step 850, it is determined if an edge has occurred on the data line. If an edge has occurred on data, then the XEDCU will inform Latch LB 120 and proceed to step 860. Step 850 is used to record an edge or transition on the data line. If an edge occurs during this step, the incoming signal is either a noise signal or a delayed data signal. If the edge does occur then the contents of LB are complemented.

At step 860, fault recovery is performed to correct the error value stored in the latch. After the fault recovery, the correct value is loaded into Latch PH1 at step 870 and the decision flow returns to step 820 to check the value of Sample2. Fault-Recovery involves processing of the incoming data by the XEDCU 150 and latching in the corrected data into Latch PH1.

At step 825, after determining that Sample2 is low, the XEDCU determines if Sample3 is "high" or "low." If Sample3 is "low," then the decision flow ends by continuing to step 830. If Sample3 is "high" then decision flow continues to step 835. In the embodiment shown in FIG. 2, Case 3, step 825 is used to distinguish between a delayed signal and a noise pulse.

At step 835, XEDCU determines if Latch LB is set. Latch is set when its current state is logic 1. If LB is not set, then the DATA is noise free 845. If LB is set, the decision flow continues to step 840.

At step 840, it is determined if an edge has occurred on the data line. If an edge has occurred on data, then the XEDCU 150 proceeds to step 860. If an edge has not occurred, then the decision flow returns to step 820 where the status of Sample3 is determined again.

In one embodiment, the XTFF was implemented using transistor models from the TSMC 0.18μ library. Switch level simulations were carried out using the Cadence simulation tool Spectre and verified. Successful operation and verification of the XTFF requires observing the constraints mentioned in equations (1), (2), (3) and (4). Routing delays vary depending on the layout. These delays need to be considered when implementing the XTFF at the layout level.

$$T_{Xpulse} > T_{setup} + T_{hold} \qquad (1),$$

$$T_{s2} > T_{s3} > T_{Xpulse} \qquad (2),$$

$$T_{clk/2} > T_{s2} + T_{s3} + T_{dxedcu} \qquad (3),$$

$$T_{maxdelay} < T_{s2} - T_{dxedcu} \qquad (4),$$

In the equations (1), (2), (3) and (4), $T_{dxedcu}$ refers to the signal propagation delay through the block XEDCU 150. $T_{maxdelay}$ refers to the maximum transition or arrival delay that the XTFF 100 can recover from. Accurate estimation of $T_{dxedcu}$ is critical to the successful operation of the XTFF 100.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A crosstalk tolerant flip flop (XTFF), comprising:
   a scan flip flop having a scan master latch, a scan slave latch, a system master latch and a system slave latch; and
   a crosstalk error detection and correction unit (XEDCU) for adapting the operation of the scan flip flop to inhibit the propagation of a data signal corruption associated with single event transients, comprising:

an edge detection circuit for processing an input data signal to detect therein a logic level transition;

a noise detection and correction circuit for processing the input data signal to detect and correct a noise condition therein; and a delayed signal detection circuit for processing the input data signal to detect a delayed logic level of the input data signal.

2. The XTFF of claim 1, wherein a first sample of the input data signal is taken before an active clock edge.

3. The XTFF of claim 2, wherein a second sample of the input data signal is taken after the active clock edge.

4. The XTFF of claim 3, wherein a third sample of the input data signal is taken after the second sample.

5. The XTFF of claim 1, wherein the XEDCU is switchable between a functional mode of operation and a scan mode of operation, the functional mode of operation comprising a fault recovery scheme.

6. The XTFF of claim 1, wherein the XEDCU is switchable between a functional mode of operation and a scan mode of operation, the scan mode of operation comprising stuck-fault testing of the scan flip flop of the XTFF.

7. The XTFF of claim 1, wherein a control signal determines the operation of the XTFF.

8. A method for fault-recovery for transient pulses and signal delays in a scan flip flop having a scan master latch, a scan slave latch, a system master latch and a system slave latch, the method comprising:

receiving a first value for an input signal sampled after a clock edge on a data line;

receiving a second value for the input signal sampled after sampling the first value;

detecting a transition on the data line, wherein said detecting is performed by a edge detection circuit to produce thereby an edge detection value, wherein the first value and the second value comprise inputs to the edge detection circuit, and wherein the edge detection value is stored in the scan slave latch of the scan flip flop;

filtering a noise pulse if the input signal is a transient pulse, wherein said filtering is performed by a noise detection and correction circuit, and wherein the edge detection value stored in the scan slave latch comprises an input to the noise detection and correction circuit;

recovering data from a delayed signal, wherein said recovering is performed by a delayed signal detection circuit, and wherein the edge detection value stored in the scan slave latch comprises an input to the delayed signal detection circuit; and latching a correct data signal into the system slave latch of the scan flip flop.

9. The method of claim 8, wherein a correct value for the system slave latch is determined in response to sampled first and second values.

10. The method of claim 8, further comprising comparing the input signal with an output signal of the system master latch.

11. The method of claim 8, further comprising switching between a functional mode of operation and a scan mode of operation.

12. An apparatus for use in a scan flip flop having a scan master latch, a scan slave latch, a system master latch and a system slave latch, comprising:

means for receiving a first value for an input signal sampled after a clock edge on a data line;

means for receiving a second value for the input signal sampled after sampling the first value;

means for detecting a transition on the data line, wherein the first value and the second value comprise inputs to said means for detecting, and wherein said means for detecting is configured to output an edge detection value, the edge detection value being stored in the scan slave latch of said scan flip flop;

means for filtering a noise pulse if the input signal is a transient pulse, wherein the edge detection value stored in the scan slave latch comprises an input to said means for filtering;

means for recovering data from a delayed signal, wherein the edge detection value stored in the scan slave latch comprises an input to said means for recovering; and means for latching a correct data signal into the system slave latch of the scan flip flop.

13. The apparatus of claim 12, further comprising means for determining a correct value for the system slave latch in response to the received first value and received second value.

14. The apparatus of claim 12, further comprising means for comparing the input signal with an output signal of the system master latch.

15. The apparatus of claim 12, further comprising means for switching between a functional mode of operation and a scan mode of operation.

16. The apparatus of claim 15, wherein the functional mode of operation comprises a fault recovery scheme.

17. The apparatus of claim 15, wherein the scan mode of operation comprises manufacturing test of the latches of the scan flip flop.

* * * * *